US006820233B2

(12) United States Patent
Johansson et al.

(10) Patent No.: US 6,820,233 B2
(45) Date of Patent: Nov. 16, 2004

(54) RE-USE OF STATIC CHECKSUM INFORMATION IN HEADER COMPRESSION/DECOMPRESSION APPLICATIONS

(75) Inventors: Ingemar Johansson, Lulea (SE); Krister Svanbro, Lulea (SE); Lars-Erik Jonsson, Lulea (SE); Hans Hannu, Lulea (SE); Stefan Hakansson, Lulea (SE); Mikael Degermark, Lulea (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 676 days.

(21) Appl. No.: 09/753,365

(22) Filed: Jan. 2, 2001

(65) Prior Publication Data

US 2002/0026620 A1 Feb. 28, 2002

Related U.S. Application Data

(60) Provisional application No. 60/218,472, filed on Jul. 14, 2000.

(51) Int. Cl.[7] ......................... G06F 11/10; H03M 11/00

(52) U.S. Cl. ........................................ 714/808; 370/913

(58) Field of Search ................................. 714/807, 808; 370/349, 913

(56) References Cited

U.S. PATENT DOCUMENTS 5,935,268 A * 8/1999 Weaver ...................... 714/807
5,987,022 A * 11/1999 Geiger et al. ............... 370/349

FOREIGN PATENT DOCUMENTS

WO WO 00 79763 A * 12/2000

OTHER PUBLICATIONS

Degermark, M. et al.: "low–Loss TCP/IP Headrer Compression for Wireless Networks", Wireless Networks, ACM, US vol. 3, No. 5, Oct. 1, 1997, pp 375–387, XP000728935, ISSN: 1022–0038.*

Larzon, L.–A.; Degermark, M.; Pink, S.; "Efficient use of wireless bandwidth for multimedia applications",Mobile Multimedia Communications, 1999. (MoMuC '99) 1999 IEEE International Workshop on , Nov. 15–17, 1999, pp187–193.*

Degermark et al., "Robust Checksum–Based Header Compression (ROCCO)", Jun. 15, 2000, Network Working Group Internet Draft, http://www.ludd.luth.se/users/larsman/rocco/drafts/draft–ietf–rohc–rtp–rocco–01.txt, pp 1–67.*

Network Working Group, RFC 1144: "Compressing TCP/IP Headers for Low–Speed Serial Links", V. Jacobson, Author, Feb., 1990.*

Degermark M et al.: "Low–Loss TCP/IP Header Compression For Wireless Networks", Wireless Networks, ACM, US, vol. 3, No. 5, Oct. 1, 1997, pp. 375–387, XP000728935, ISSN: 1022–0038 *the whole document*.

* cited by examiner

*Primary Examiner*—Albert Decady
*Assistant Examiner*—John P Trimmings
(74) *Attorney, Agent, or Firm*—Jackson Walker L.L.P.

(57) ABSTRACT

In packet communications that employ header compression/decompression, the computational complexity of checksum generation can be reduced by re-using static checksum information associated with header bits that do not change from header to header. The static checksum information can be used together with information about header bits that do change from header to header, in order to generate a desired checksum. The checksum can then be used to verify a reconstructed header produced from a compressed header by a header decompressor.

33 Claims, 6 Drawing Sheets

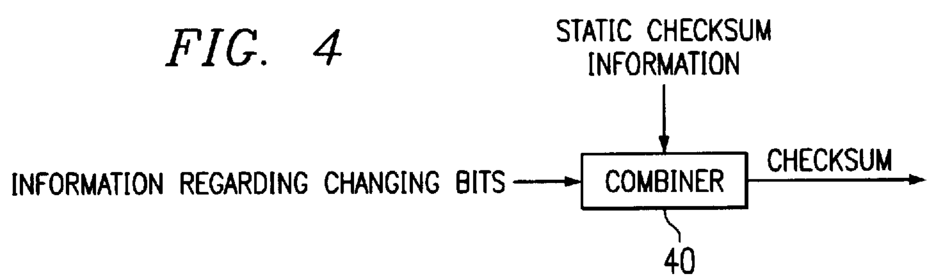
FIG. 4
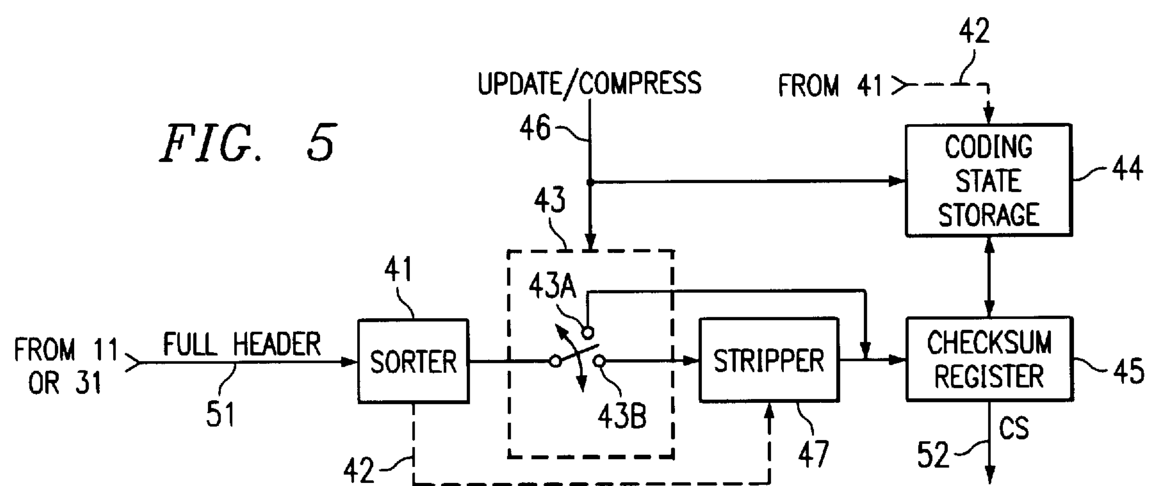
FIG. 5
FIG. 6
T — TRANSIENT BITS | S — STATIONARY BITS → TO 43
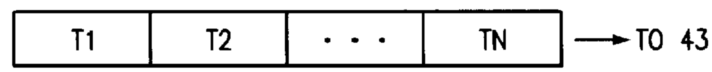
FIG. 6A Header update:

Zero the transient bits of IP header
$C_0$ = CRC of manipulated IP header above

Compressed header:

```
1  for each guess
2      C' = C_0
3      for n=1 to N_transient bits
4         if b_n == 1
5            C'  = C' XOR C_en
6      end
```

```
for each guess
  C' = C0
  if MSB part == MSBpattern0
    C' = C' XOR CSo
  else
    C' = C' XOR CS+1 // MSB is incremented by one
  end
  for n=1 to NLSB bits
    if bn == 1
      C' = C' XOR Cen
  end
```

RE-USE OF STATIC CHECKSUM INFORMATION IN HEADER COMPRESSION/DECOMPRESSION APPLICATIONS

This application claims the priority under 35 USC 119 (e)(1) of copending U.S. provisional application No. 60/218,472 filed on Jul. 14, 2000.

FIELD OF THE INVENTION

The invention relates generally to header compression/decompression in packet flows and, more particularly, to the calculation of checksums for use by a header compressor or decompressor.

BACKGROUND OF THE INVENTION

The wide popularity of personal wireless communication devices such as cellular telephones and others, combined with the increasing use of the Internet, has driven a desire to provide Internet Protocol (IP) traffic over wireless communication links. Due to the relatively scarce communication resources available in conventional wireless communication links, various techniques have been developed to compress the information included in the headers of data packets, for example the IP headers used in packets that carry IP traffic. In the transmitting station, the full header information is compressed by a header compressor, and the compressed header information is transmitted over the wireless communication link. At the receiving station, a header decompressor reconstructs the full header from the compressed header information that was transmitted. This reduces the amount of wireless communication link resources necessary for transmission of the header information.

FIG. 1 diagrammatically illustrates an example of a conventional wireless communication station (e.g., a cellular telephone) that provides for wireless packet communications (for example IP traffic) with header compression/decompression. In the example of FIG. 1, a packet processor 14 is coupled for bidirectional communication with a communications application 11 and a wireless communications interface 13. The packet processor 14 receives communications information from the communications application 11, and assembles this information into appropriate packets, which are then forwarded to the wireless communications interface 13 for transmission across a wireless communication link 15. The packets 10 produced by the packet processor 14 include a header portion 18 and a payload portion 16. Payload portion 16 includes payload information, and the header portion 18 includes compressed header information 17 and a checksum 19. As shown in FIGS. 1 and 2, the packet processor 14 uses a header compressor 21 to compress full header information received from the communications application 11 in order to produce the compressed header information 17. Also, the packet processor 14 uses a checksum generator 12 to produce the checksum 19, which checksum covers the full header information.

When the communication station of FIG. 1 receives a packet 10 via the wireless communication link 15, the packet processor 14 uses a header decompressor and the checksum generator 12 to reconstruct the full header information from the compressed header information 17 and the checksum 19. The header from which the compressed header information was produced is the target header that the reconstructed header attempts to match. The reconstructed full header information is then provided to the communications application 11 along with the payload information. When a context update occurs, additional information to update the context is added to the header by the transmitting end, and checksum generation is needed at the receiving end (see broken line in FIG. 3).

In some known header compression/decompression schemes, the decompressor attempts to guess (or estimate) the full header from the received compressed header information. Such techniques can be effective because some portions of a packet header can usually be expected to change in a relatively easily predictable fashion. For example, some conventional real time voice applications utilize in their headers time stamp fields that are relatively easily predictable. Other examples include real time video applications, and headers for regular best effort services such as, for example, FTP. When the decompressor makes a guess of (or estimates) the full header, a checksum is generated based on this guess/estimate, and is then compared to the checksum that was received with the compressed header. This is illustrated in FIG. 3. The guess generator 31 of the header decompressor of packet processor 14 receives the compressed header information 17 from the wireless communications interface 13. The full header guess produced by the guess generator is then applied to a checksum generator 12, which produces therefrom a checksum 19'. This checksum 19' is then compared at 33 to the checksum 19 received with the compressed header information. If the checksums match, then the guess/estimate is considered to be a correct reconstruction of the target header. However, if the checksums do not match at 33, then the guess generator 31 is instructed to guess again, whereupon the above-described checksum generation and comparison process is repeated.

Disadvantageously, the checksum generation process described above with respect to both header compression and header decompression is computationally complex, and the computational requirements at the decompressor increase as the number of guesses increases.

It is therefore desirable to reduce the computational complexity associated with checksum generation in header compressors and decompressors.

The present invention reduces the computational complexity of checksum generation by utilizing static checksum information associated with header bits that do not change from header to header. This static checksum information can be used together with information about header bits that have changed, in order to generate the desired checksum. According to some embodiments, a static checksum coding state associated with the unchanging header bits can be used in combination with the changing header bits themselves to produce the desired checksum. In other embodiments, a checksum component associated with the unchanging header bits can be used in combination with checksum components associated with the changing header bits to produce the checksum. The use of static checksum information advantageously reduces the computational complexity of checksum generation. The reduced-complexity checksum generation of the present invention can be used to calculate checksums associated with reconstructed headers at a header decompressor, and can also be used at the compressor end to calculate the checksums that are transmitted along with the compressed header information.

BRIEF DESCRIPTION OF THE DRAWINGS

FIG. 4 diagrammatically illustrates checksum generation according to the invention.

FIG. 5 diagrammatically illustrates pertinent portions of exemplary embodiments of a checksum generator according to the invention.

FIG. 6 illustrates one exemplary operation which can be performed by the sorter of FIG. 5.

FIG. 6A illustrates another exemplary operation which can be performed by the sorter of FIG. 5.

DETAILED DESCRIPTION

The present invention recognizes that some header information will not change for long periods of time (or at all) during a given packet flow. Examples of such unchanging (also referred to herein as stationary or static) header information include IP source and destination addresses. This unchanging header information will contribute an unchanging component to the checksums calculated in connection with the headers of the packet flow. Thus, from header to header, the invention re-uses this unchanging or static checksum component, combining it repeatedly with information about the header bits that are changing from header to header, in order to generate the checksums for the various headers. This is illustrated generally in FIG. 4, wherein a combiner 40 receives at respective inputs thereof the static checksum information and the information about the changing bits, and produces therefrom a checksum, for example a CRC (cyclic redundancy code) checksum or a one's complement checksum.

Figure 1:
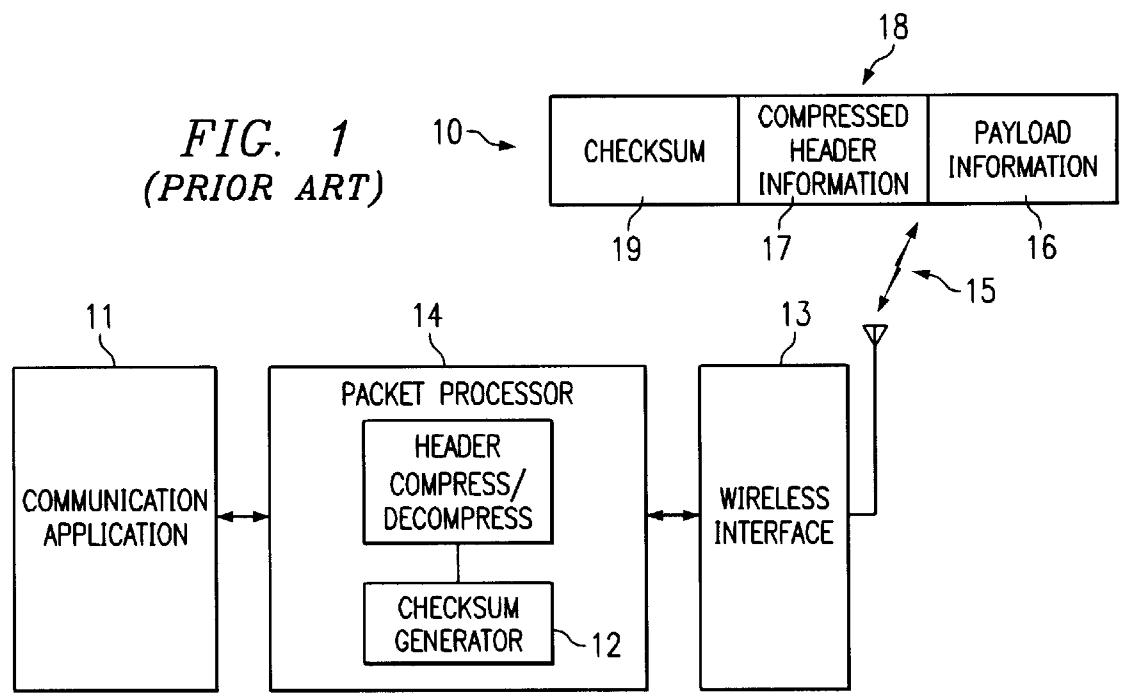
FIGS. 1–3 illustrate prior art header compression/decompression and checksum generation used in wireless communication devices.
Figure 2:
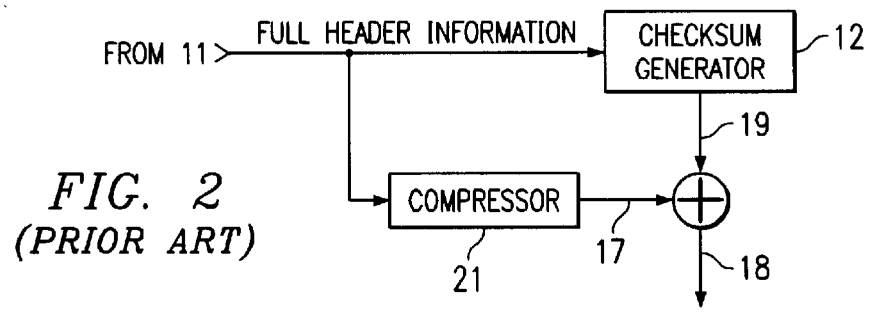
Figure 3:
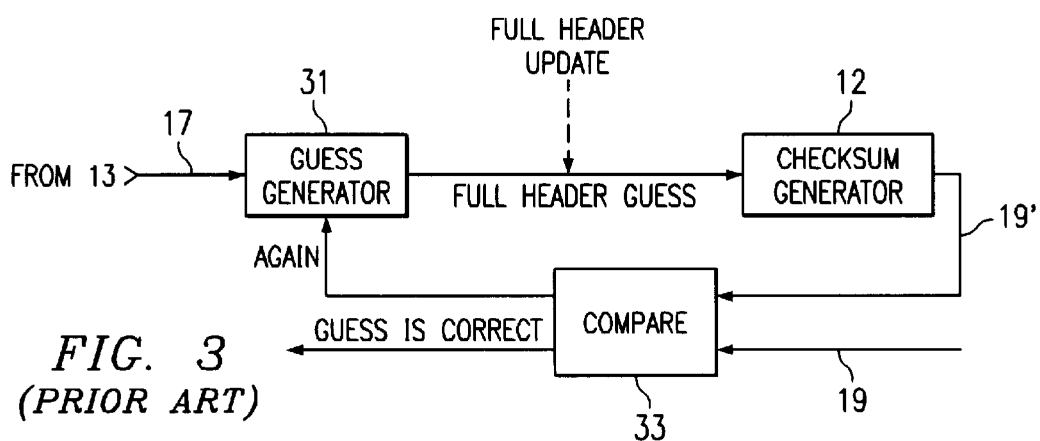

FIG. 5 diagrammatically illustrates pertinent portions of exemplary embodiments of a checksum generator according to the invention. The checksum generator of FIG. 5 receives a full header at 51, and outputs in response thereto a checksum CS at 52. The checksum generator of FIG. 5 can be provided in a packet processor such as illustrated at 14 in FIG. 1. Moreover, the checksum generator of FIG. 5 can be used in conjunction with header compression as illustrated generally in FIG. 2, or with header decompression as illustrated generally in FIG. 3. Thus, the full header at 51 represents either a fall header received from a communications application such as illustrated at 11 in FIGS. 1 and 2 (i.e., a context update header or the target header to be compressed and reconstructed), or a reconstructed full header produced by a header decompressor, for example, the full header guess illustrated at 31 in FIG. 3.

The checksum generator of FIG. 5 may include a sorter 41 which receives the full header 51 and sorts the bits thereof into a stationary bit part S (see also FIG. 6) and a transient (or changing) bit part T. The stationary bit part S includes the bits which are unchanging during the packet flow, and the transient bit part T includes the bits which are changing during the packet flow. The output of the sorter 41 is provided to a switch 43 which is controlled by an update/compression signal 46 indicative of whether the full header is associated with a header context update or is associated with normal header compression/decompression operations. During a context update, the signal 46 controls switch 43 to the position 43A, such that the full header is shifted directly into a checksum register 45 which can use conventional (e.g., CRC) techniques to produce the checksum CS at 52.

As shown in FIG. 6, the sorter 41 sorts the header bits such that the stationary bits S enter the checksum register before the transient bits T do. When all of the stationary bits S have been shifted (via switch node 43A) into the checksum register 45, the coding state of the checksum register 45 at that point in time is stored in coding state storage at 44. This stored coding state is a static checksum coding state associated with the unchanging stationary bits, and therefore can be re-used in the generation of subsequent checksums during header compression/decompression operations.

During header compression/decompression operations, the signal 46 controls switch 43 to position 43B, such that the output of sorter 41 is applied to a stripper 47. The stripper 47 strips off the stationary bits S, such that only the transient bits T will be shifted into the checksum register 45. Before shifting the transient bits T into the checksum register 45, however, the previously stored static checksum coding state is retrieved from coding state storage 44 and loaded into the checksum register 45. Once this coding state has been loaded into the checksum register 45, the transient bits T output by the stripper 47 are shifted into the checksum register 45, thereby producing the desired checksum at 52. This use of the previously stored static checksum coding state thus advantageously reduces the number of bits which must be shifted into the checksum register 45 to produce the desired checksum at 52.

Conventional IP protocol examples of the transient bits T in FIG. 6 include the IP-ID, and the RTP sequence number. The IP-ID is unique for every packet sent and, although in some cases is incremented by one for every packet sent, is more normally incremented by more than one. The RTP sequence number tells when the packet should be presented to the user. For example, if the packet contains speech data, the RTP sequence number tells when the speech data should be decoded and output to the speaker.

Figure 7:
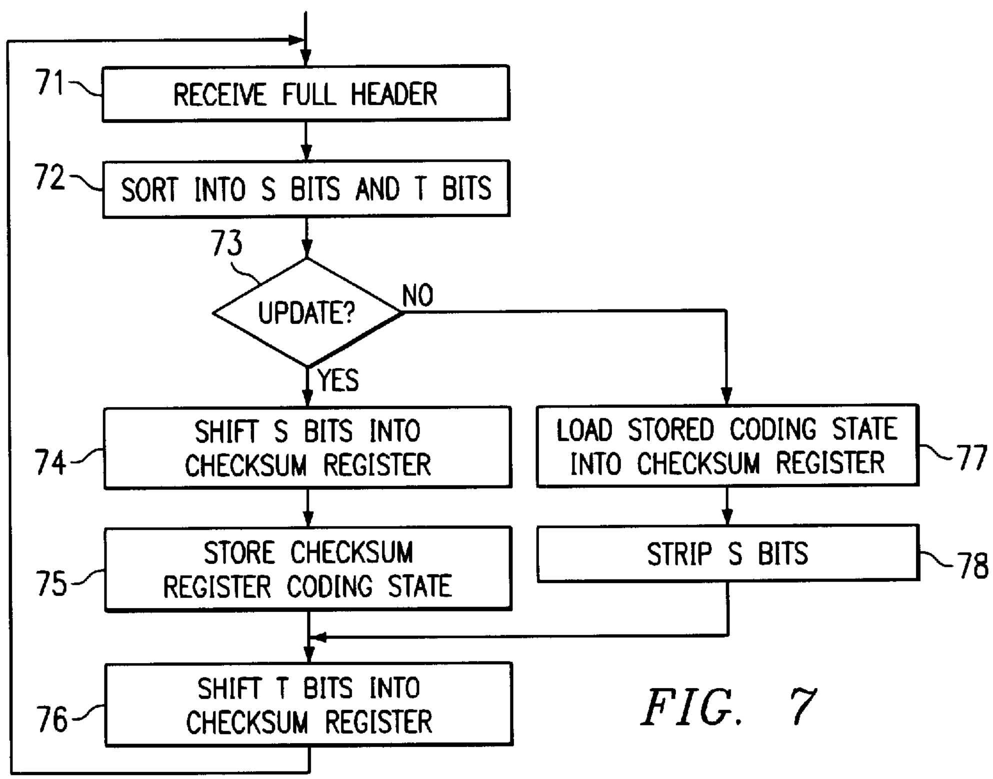
FIG. 7 illustrates exemplary operations which can be performed by the embodiment of FIG. 5 in conjunction with the sorter operation of FIG. 6.

FIG. 7 illustrates exemplary operations which can be performed by the checksum generator of FIG. 5. After receiving the full header at 71, the header bits are sorted into stationary bits and transient bits at 72. For a full header (context) update at 73, the stationary bits are shifted into the checksum register at 74. Once the stationary bits have been shifted into the checksum register at 74, the checksum register coding state is stored at 75, after which the transient bits are then shifted into the checksum register at 76.

When there is no header update at 73 (i.e., normal header compression/decompression operation), the stored coding state is loaded into the checksum register at 77, and the stationary bits are stripped from the full header at 78. Thereafter, the transient bits are shifted into the checksum register at 76.

FIG. 6A illustrates further exemplary sorting operations which can be performed in some embodiments by the sorter 41 of FIG. 5. In the example of FIG. 6A, the transient bits of FIG. 6 are further sorted according to the probability of changing. For example, the least significant bits of the IP-ID and the RTP sequence number would be placed leftmost, at T1, T2, etc. in the example of FIG. 6A. By contrast, the bits with the least probability of changing, for example the most significant bits of the IP-ID and the RTP sequence number would be positioned rightmost in FIG. 6A, namely at and adjacent to bit TN. When this sorting operation is used, a plurality of coding states can be stored in coding state storage 44. For example, when a full header is received during a context update, the coding state is stored at the point when all of the stationary bits S have been shifted into the checksum register 45, and the coding state is also stored after shifting each of the transient bits of FIG. 6A into the checksum register 45. The sorter 41 maintains a record of the sorted version of the transient bits used to generate the coding states stored at 44. From this record, the sorter 41 can, during normal compression/decompression operations, indicate at 42 to stripper 47 and coding state storage 44 the location of the first transient bit of the current full header that differs from the full header that was used to produce the stored coding states. The stripper then strips off all of the stationary bits and all of the unchanged transient bits, and the checksum register 45 is loaded with the stored coding state corresponding to the unchanged bits, so that only the changed transient bits are required to be shifted into the checksum register 45.

Figure 7A:
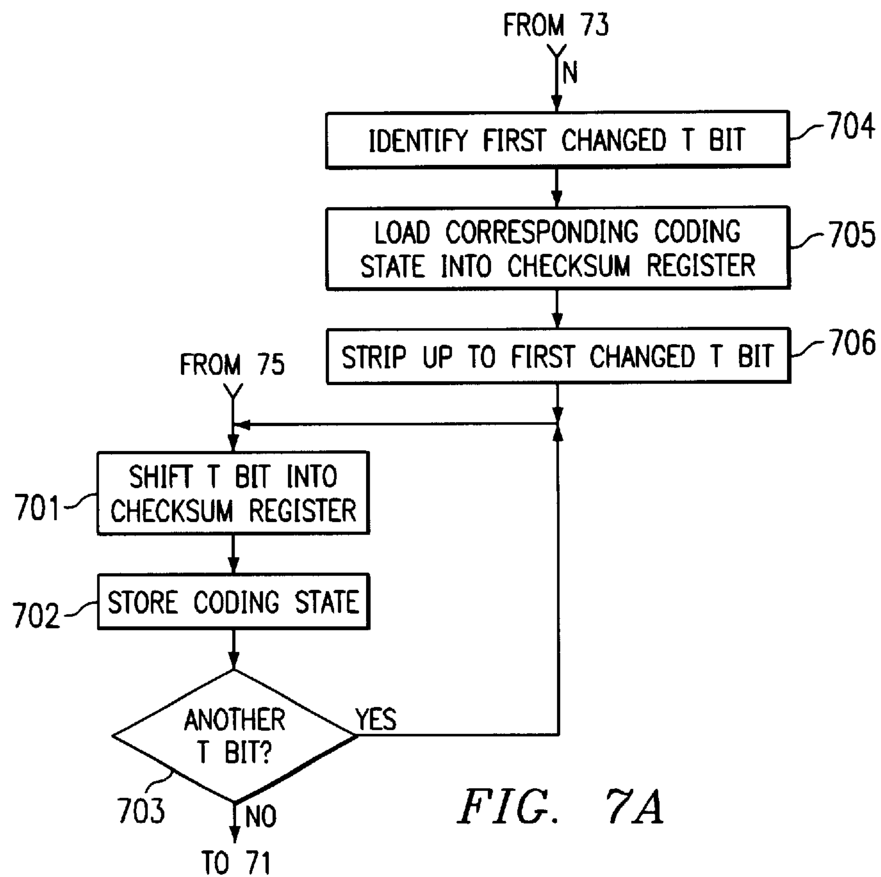
FIG. 7A illustrates exemplary operations which can be performed by the embodiment of FIG. 5 in conjunction with the sorter operation of FIG. 6A.

FIG. 7A, when taken in conjunction with FIG. 7, illustrates exemplary operations which can be performed by the checksum generator of FIG. 5 in conjunction with the sorting operation of FIG. 6A. In FIG. 7A, after the checksum register coding state associated with the stationary bits has been stored at 75 in FIG. 7, the first transient bit is shifted into the checksum register at 701. The coding state associated with this transient bit is then stored at 702, and the process at 701 and 702 is repeated until all of the transient bits have been shifted into the checksum register at 701. Thereafter, operations return to 71 in FIG. 7. Also as shown in FIG. 7A, operations 704–706 are performed when the "no" (N) branch is taken from the operation at 73 in FIG. 7. At 704, the first changed transient bit is identified, and the coding state corresponding to the unchanged bits is loaded into the checksum register at 705. At 706, all bits up to the first changed transient bit are stripped from the full header, and the remaining transient bits are shifted into the checksum register at 701–703, while storing the coding state associated with each shifted bit to update the coding states associated with the bit positions that are shifted in.

Thus, according to the operations of FIG. 7A, for each reconstructed header produced during decompression, new coding states are stored while calculating the checksum for that reconstructed header. Therefore, the checksum calculation for each reconstructed header can be based on the checksum calculation (e.g., the stored coding states) from the previous reconstructed header. This is particularly useful in decompressors that produce a series of header guesses during each decompression operation (as described above), because a new checksum calculation is needed for each new guess. Similarly at the compressor end, the checksum calculation for each new header that is being compressed can be based on the checksum calculation (e.g., the stored coding states) from the header that was previously compressed.

As mentioned above, one example of the checksum generated by the present invention is the CRC checksum. This checksum, and other checksums associated with other cyclic codes, have a linear property such that, for given code words $c_1$ and $c_2$, the checksum-producing function f exhibits the following characteristic:

$$f(c_1+c_2)=f(c_1)+f(c_2) \quad \text{Equation 1}$$

Thus, the checksum obtained by combining two code words can be obtained by either combining the code words (by modulo-2 addition) first, and then computing the checksum (left side of Equation 1), or by computing the checksum for each code word and then combining the checksums by modulo-2 addition (right side of Equation 1). This linear characteristic of cyclic checksum coding is utilized by the present invention to reduce the complexity of checksum generation.

In particular, at the occasion of a header update, all transient bits of the full header can be set to 0, and an initial checksum $C_0$ can then be calculated from the thusly modified full header. Further, another set of initial checksums can be computed, one initial checksum for each transient bit position in the full header. Each of these further initial checksums is computed with all bits in the full header set to 0 except for the transient bit for which the initial checksum is computed, this bit being set to 1. Thus, for N transient bits (for example 32–48 transient bits) there are N initial checksums denoted herein as $C_{e1}$, $C_{e2}$, . . . $C_{eN}$. Advantageously, these checksums can be pre-computed and stored for later use when needed.

In view of the foregoing, when computing a checksum during header compression/decompression operations, the aforementioned checksum $C_0$ is combined (modulo-2) with the initial checksums $C_{e1}$, . . . $C_{eN}$ according to the following equation:

$$CS=C_0+b_1C_{e1}+b_2C_{e2}+\ldots+b_NC_{eN}, \quad \text{Equation 2}$$

where $b_1$ . . . $b_N$ represent the values (0 or 1) of the N transient bits, and all addition is modulo-2.

Figure 8:
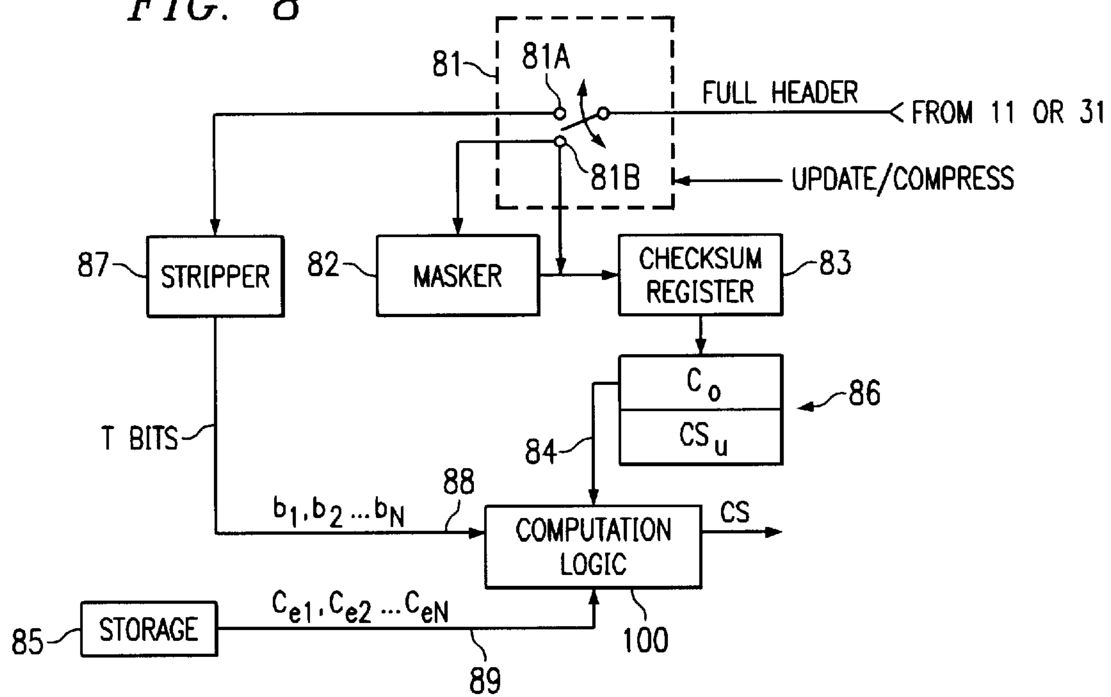
FIG. 8 diagrammatically illustrates pertinent portions of a further exemplary embodiment of a checksum generator according to the invention.

FIG. 8 diagrammatically illustrates pertinent portions of exemplary embodiments of a checksum generator which can compute checksums according to Equation 2 above. The checksum generator of FIG. 8 can be used at either the header compressor end or the header decompressor end, in the same way as described generally above with respect to FIG. 5. In FIG. 8, when a full header is received in conjunction with a context update, the switch 81 is controlled to assume position 81B. This causes the full header to be provided to a checksum register 83 and a masker 82. The checksum register 83 first produces a checksum associated with the context update and outputs this checksum $CS_U$ to a shift register 86. Thereafter, the checksum register 83 receives from the master 82 a masked version of the full header wherein all of the transient bits are set to 0. The checksum register 83 produces the initial checksum $C_0$ from this masked version of the full header, and outputs the checksum $C_0$ to the shift register 86. Thus, after operation of the checksum register 83 during a context update, the shift register 86 includes both the checksum $CS_U$ associated with the full header update, and the initial checksum $C_0$ associated with the masked version of the full header update. The checksum $CS_U$ associated with the full header context update is then available for conventional use.

During header compression/decompression operations, the switch 81 is controlled to assume position 81A, such that the full header is provided to a stripper 87 which strips therefrom the stationary bits, and forwards the transient bits $b_1$, $b_2$ . . . $b_N$ to an input 88 of computation logic 100. An input 89 of the computation logic 100 receives from storage 85 the pre-computed initial checksums $C_{e1}$, $C_{e2}$ . . . $C_{eN}$, and further receives at 84 the initial checksum $C_0$. The computation logic 100 implements Equation 2 above to produce the desired checksum CS.

Figure 9:
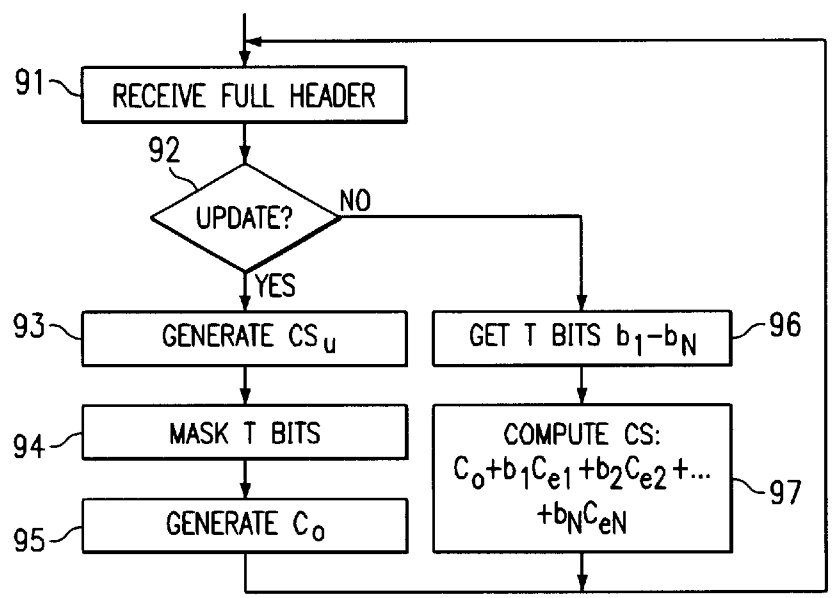
FIG. 9 illustrates exemplary operations which can be performed by the checksum generator of FIG. 8.

FIG. 9 illustrates exemplary operations which can be performed by the embodiment of FIG. 8. If a full header update is received at 91–92, then the checksum $CS_U$ is generated at 93. Then, the transient bits are masked off at 94. After masking the transient bits, the initial checksum $C_0$ is generated at 95. Thereafter, the next full header is awaited at 91. If the full header is not associated with a context update at 91–92, then the transient bits $b_1$–$b_n$ are provided at 96, and the checksum CS is computed at 97 according to Equation 2, after which the next full header is awaited at 91.

Figures 10, 11:
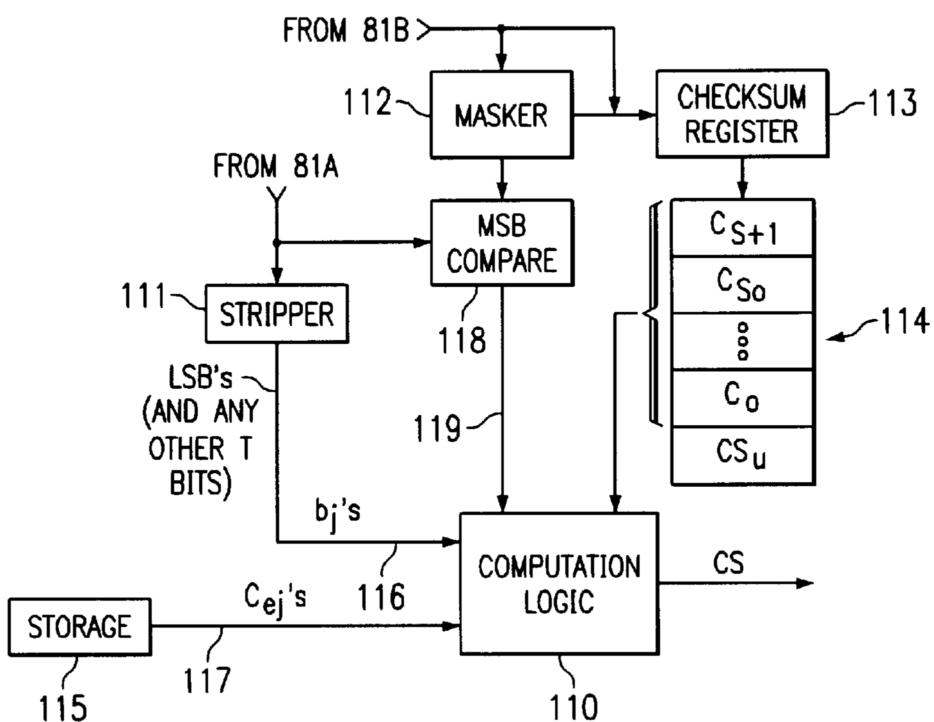
FIG. 10 illustrates exemplary pseudo code which can implement operations illustrated in FIG. 9.
FIG. 11 diagrammatically illustrates pertinent portions of a further exemplary embodiment of a checksum generator according to the invention.

FIG. 10 illustrates exemplary pseudo code which can implement operations illustrated in FIG. 9. In FIG. 10, C' generally corresponds to CS in FIGS. 8 and 9.

As can be seen from Equation 2 and FIGS. 8–10, computation of the checksum for a full header that includes N transient bits will require at most N modulo-2 additions (i.e., XOR operations). It will also be noted that, in applications where relatively few of the transient bits change from one full header guess to another full header guess, then modulo-2 additions will only be needed for those transient bits that have changed. Note also that the embodiments of FIGS. 8–10 do not include any sorting or re-ordering of the bits in the full header.

The number of modulo-2 additions in Equation 2 can be further reduced by utilizing the fact that the most significant bits (MSBs) of the value or values defined by the transient bits will very seldom change. For example, an RTP sequence number of 8192 corresponds to a bit pattern where only the 13 least significant bits (LSBs) will be changed until the RTP sequence number reaches 16384. Thus, bits 14–32 of the RTP sequence number will remain unchanged for a very long period of time. Accordingly, an initial checksum associated with the MSBs can be computed at the same time as the aforementioned checksum $C_0$ is computed. This checksum corresponding to the MSBs permits the number of modulo-2 additions in Equation 2 to be reduced by one less than the number of MSBs. This approach of computing initial checksum values for the MSBs of a given part of the transient bits can be applied to any part of the transient bits that defines a value whose MSBs will not change for a very long period.

Taking the RTP sequence number as an example, assume that the RTP sequence number is 32 bits long, that the most significant 16 bits will not change for a very long period of time, and that the RTP sequence number can only be incremented. Upon the occasion of a context update, an initial checksum $C_{S0}$ can be computed in addition to the aforementioned checksum $C_0$. The checksum $C_{S0}$ is computed with all header bits set to 0 except the 16 MSBs of the RTP sequence number. In addition, another initial checksum $C_{S+1}$ can be computed. This latter checksum is computed by incrementing the MSB part by 1, and then zeroing out all header bits except the 16 MSBs. The checksum $C_{S0}$ will be used in computing the full header checksum until the MSBs change (i.e., increase by 1), whereupon $C_{S0}$ will be replaced by $C_{S+1}$ in the checksum computation. Thus, until the MSBs change, the checksum for the full header can be computed as follows:

$$CS = C_0 + C_{S0} + \sum_j b_j C_{ej}, \qquad \text{Equation 3}$$

where j indexes the bit positions of the remaining transient bits not accounted for by the checksum $C_{S0}$, and all additions are modulo-2 additions. In the aforementioned RTP sequence number example, the checksum $C_{S0}$ accounts for 16 transient bits, (i.e., the 16 MSBs), so Equation 3 has 15 fewer modulo-2 additions than does Equation 2. As mentioned above, when the MSB part of the RTP sequence number changes, then the aforementioned checksum $C_{S+1}$ will be substituted for $C_{S0}$ in Equation 3.

Assuming that one or more other values represented by the transient bits can be divided into an LSB part and an MSB part that changes very infrequently, then the aforementioned checksums $C_{S0}$ and $C_{S+1}$ can be computed for the MSBs of each of those values. Equation 4 below illustrates the checksum computation where respective checksums $C_{S0}$ (1) and $C_{S0}$ (2) are calculated for two different values represented by the transient bits:

$$CS = C_0 + C_{S0}(1) + C_{S0}(2) + \sum_j b_j C_{ej}, \qquad \text{Equation 4}$$

where j indexes the bit positions of the remaining transient bits not accounted for by $C_{S0}$ (1) and $C_{S0}$ (2), and all additions are modulo-2. Assuming that both of the checksums $C_{S0}$ (1) and $C_{S0}$ (2) account for 16 MSBs, Equation 4 requires 30 fewer modulo-2 additions than does Equation 2, and 15 fewer than does Equation 3. Thus, the computation complexity in generating the checksum CS can be significantly reduced to the extent that the transient bits represent numbers having MSBs which change very infrequently.

FIG. 11 diagrammatically illustrates pertinent portions of exemplary embodiments of a checksum generator which can implement Equations 3 and 4 above. The checksum generator of FIG. 11 can be used in conjunction with the switch 81 of FIG. 8, such that, when the switch 81 is controlled to position 81B during a header context update, the full header is provided to a checksum register 113 and a masker 112. The checksum register 113 can calculate the header update checksum $CS_U$ described above with respect to FIG. 8. This checksum $CS_U$ is output from checksum register 113 to a shift register 114, where it is made available for conventional use. After checksum $CS_U$ has been generated, the checksum register 113 receives from masker 112 suitably masked (and incremented in the case of $C_{S+1}$) versions of the full header to be used in the above-described computation of the checksums $C_0$, $C_{S0}$ and $C_{S+1}$. These checksums are also output from the checksum register 113 into the shift register 114. Note that a unique set of checksum values $C_{S0}$ and $C_{S+1}$ can be computed for the MSBs of each of a plurality of values defined by the transient bits.

When the switch 81 of FIG. 8 is in position 81A during normal compression/decompression operation, the full header (or full header guess) is applied to a stripper 111 which strips therefrom all of the stationary bits and all of the transient bits accounted for by the checksum sets $C_{S0}$ and $C_{S+1}$ stored in the shift register 114. The transient bits remaining after this stripping operation include the LSBs associated with the checksum sets stored in shift register 114 (and possibly any other transient bits unaccounted for by any of the checksum sets). These unaccounted for transient bits ($b_j$'s) are input at 116 to computation logic 110 along with the corresponding (pre-computed and stored) checksums ($C_{ej}$'s) at 117. The checksums provided at 117 come from storage 115. The computation logic 110 also receives as input the checksum $C_0$ and the checksum set(s) $C_{S0}$ and $C_{S+1}$. The computation logic 110 produces the desired checksum CS according to either Equation 3 or Equation 4. The question of whether to use $C_{S0}$ or $C_{S+1}$ for a given set of MSBs is resolved by a comparator 118 that compares each set of MSBs received from 81A with the corresponding set of MSBs that was used to generate the associated $C_{S0}$. The MSBs used to generate $C_{S0}$ can be stored in the masker 112 for use by the comparator 118. If the MSBs match at comparator 118, then comparator output 119 signals computation logic 110 to use $C_{S0}$, Otherwise, $C_{S+1}$ is used.

Figures 12, 13:
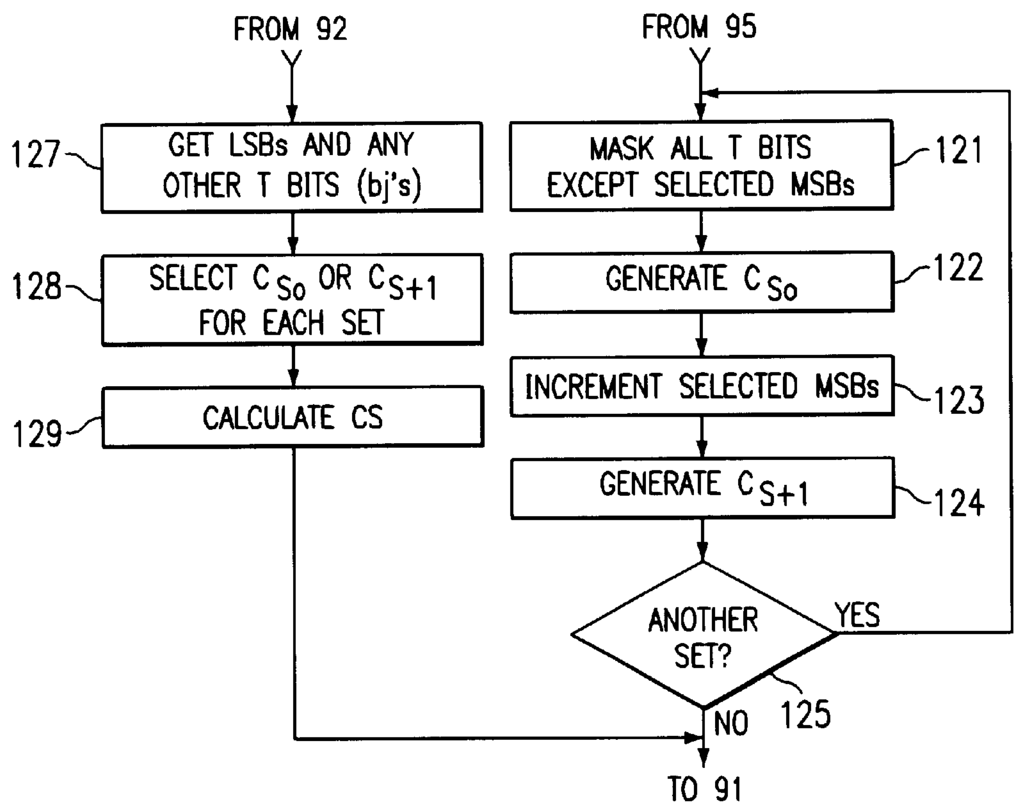
FIG. 12 illustrates exemplary operations which can be performed by the checksum generator of FIG. 11.
FIG. 13 illustrates exemplary pseudo code which can implement operations shown in FIG. 12.

FIG. 12 (taken in consideration with FIG. 9) illustrates exemplary operations which can be performed by the checksum generator of FIG. 11. After the checksum $C_0$ has been generated at 95 in FIG. 9, all of the transient bits except a selected MSB part thereof are masked at 121, and the checksum $C_{S0}$ is generated at 122. Thereafter at 123, the selected MSB part is incremented at 123, and the checksum $C_{S+1}$ is generated at 124. The steps at 121–124 are repeated until it is determined at 125 that all desired sets of checksums $C_{S0}$ and $C_{S+1}$ have been calculated. At that time, operations return to 91 in FIG. 9. Operations can also commence in FIG. 12 after a "no" (N) decision at 92 in FIG. 9. That is, if the received full header does not constitute a context update, then at 127 the LSBs and any other transient bits ($b_j$'s) are obtained. At 128, the checksum $C_{S0}$ or $C_{S+1}$ is selected from each $C_{S0}/C_{S+1}$ set. Thereafter at 129, the checksum CS is calculated, for example according to Equation 3 or 4, after which operations return to 91 in FIG. 9.

FIG. 13 illustrates exemplary pseudo code which can implement operations illustrated in FIG. 12. In FIG. 13, C' generally corresponds to CS in FIGS. 11 and 12. Although only a single $C_{S0}/C_{S+1}$ set is considered in FIG. 13, as many sets as desired can easily be considered by duplicating lines 3–11 for each $C_{S0}/C_{S+1}$ set.

It should be noted with respect to the embodiments of FIGS. 11–13 that, for each set of MSBs, the corresponding $C_{S0}/C_{S+1}$ set must be updated periodically. However, such updates are very rare and very inexpensive, and it is also very easy to add to the $C_{S0}/C_{S+1}$ set an extra checksum value corresponding to a +2 increment of the MSBs, namely $C_{S+2}$, in order to make the required updates less frequent.

It will be evident to workers in the art that the embodiments illustrated in FIGS. 4–13 can be readily implemented by suitable modifications in software, hardware, or a combination of both software and hardware, in the checksum generation portion of conventional wireless communication devices that utilize header compressors and decompressors.

Although exemplary embodiments of the invention are described above in detail, this does not limit the scope of the invention, which can be practiced in a variety of embodiments.

What is claimed is:

1. A method of generating checksums for use in verifying reconstructed headers that a packet receiving station produces from compressed headers received from a packet transmitting station, the compressed headers produced by compressing target headers at the packet transmitting station, comprising:

providing static checksum information associated with a static portion of a target header that carries static information which remains unchanged in corresponding static portions of all headers in a packet flow, including producing the static checksum information by coding the static information from a header that precedes the target header in the packet flow;

providing further information representative of a transient portion of the target header that carries information which can differ from corresponding information in corresponding transient portions of other headers of the packet flow; and combining the static checksum information and the further information to generate a checksum for use in verifying a reconstructed header that corresponds to the target header.

2. The method of claim 1, wherein the packet receiving station and the packet transmitting station are wireless communication devices.

3. The method of claim 1, wherein the previous header is a context update header in the packet flow, said coding step including applying the static information from the static portion of the context update header to a checksum register without applying to the checksum register the information from the transient portion of the context update header, and storing a coding state of the checksum register after said applying step.

4. The method of claim 3, wherein said combining step includes loading the stored coding state into the checksum register and thereafter applying the further information to the checksum register.

5. The method of claim 4, wherein said step of providing static checksum information includes sorting the context update header to separate the static portion thereof from the transient portion thereof, said step of applying the information from the static portion of the context update header including shifting the information into the checksum register, and said step of applying the further information to the checksum register including shifting the further information into the checksum register.

6. The method of claim 4, wherein said step of providing further information includes sorting one of the target header and the reconstructed header to separate the static portion thereof from the transient portion thereof.

7. The method of claim 6, wherein said one header is the target header and the further information is the information in the transient portion of the target header.

8. The method of claim 6, wherein said one header is the reconstructed header and the further information is information in the transient portion of the reconstructed header that represents the information in the transient portion of the target header.

9. The method of claim 1, wherein said step of providing static checksum information includes providing a context update header in the packet flow, sorting said context update header to separate the static portion thereof from the transient portion thereof, further sorting the information in the transient portion of said context update header according to probabilities that respective parts of the information will change during the packet flow, said coding step including shifting said sorted and further sorted context update header into a checksum register and, for each combination of static information and transient information that appears in the checksum register during said shifting operation, storing a corresponding coding state of the checksum register.

10. The method of claim 9, wherein said step of providing further information includes sorting the information in the transient portion of one of the target header and the reconstructed header according to probabilities that respective parts of the information will change during the packet flow, said combining step including loading one of said stored coding states into the checksum register and thereafter shifting into the checksum register a part of the transient portion of said one header that differs from the corresponding part of the context update header.

11. The method of claim 10, wherein said one header is the reconstructed header, and said coding step including storing further coding states of the checksum register that respectively correspond to each shift in said last-mentioned shifting step, and loading one of the stored further coding states into the checksum register and thereafter shifting into the checksum register a part of the transient portion of a subsequent reconstructed header that differs from the corresponding part of said one reconstructed header, thereby to generate a checksum for use in verifying the subsequent reconstructed header, said subsequent reconstructed header also corresponding to the target header.

12. The method of claim 1, wherein said static checksum information includes a first checksum component associated with the static information in the packet flow.

13. The method of claim 12, wherein said step of providing further information includes providing a plurality of further checksum components, each of the further checksum components representing an associated bit position of the transient portion of the headers in the packet flow.

14. The method of claim 13, wherein said step of providing further information includes selecting at least some of the further checksum components based on bit values in the transient portion of one of the target header and the reconstructed header, said combining step including combining the selected further checksum components with the first checksum component to produce the checksum.

15. The method of claim 14, wherein said combining step includes adding, modulo-2, each of the selected further checksum components to the first checksum component.

16. The method of claim 14, wherein said selecting step includes selecting based on bit values in the target header.

17. The method of claim 14, wherein said selecting step includes selecting based on bit values in the reconstructed header.

18. The method of claim 13, wherein said step of providing static checksum information includes generating a second checksum component that represents plural bit positions in the transient portion of the headers in the packet flow.

19. The method of claim 18, wherein said combining step includes combining the second checksum component with the further checksum components and the first checksum component to produce the checksum.

20. The method of claim 1, wherein the checksum is a CRC checksum.

21. The method of claim 1, including the packet receiving station performing said combining step.

22. The method of claim 1, including the packet transmitting station performing said combining step.

23. An apparatus for generating checksums for use in verifying reconstructed headers that a packet receiving station produces from compressed headers received from a packet transmitting station, the compressed headers produced by compressing target headers at the packet transmitting station, comprising:

a first input for receiving static checksum information associated with a static portion of a target header that carries static information which remains unchanged in corresponding static portions of all headers in a packet flow, said static checksum information produced by coding the static information from a header that precedes the target header in the packet flow;

a second input for receiving further information representative of a transient portion of the target header that carries information which can differ from corresponding information in corresponding transient portions of other headers of the packet flow; and a combiner coupled to said first and second inputs for combining the static checksum information and the further information to generate a checksum for use in verifying a reconstructed header that corresponds to the target header.

24. The apparatus of claim 23, provided in a wireless communication device.

25. The apparatus of claim 23, wherein said combiner includes a checksum register coupled to said second input for shifting the further information into said checksum register, wherein the static checksum information includes a coding state of said checksum register produced by said checksum register in response to said static information from said preceding header, and further including a storage device coupled to said checksum register for storing therein said coding state, said storage device coupled to said first input for loading said coding state into said checksum register prior to shifting the further information into said checksum register.

26. The apparatus of claim 25, wherein the further information is the information in the transient portion of the target header.

27. The apparatus of claim 25, wherein the further information is information in the transient portion of the reconstructed header that represents the information in the transient portion of the target header.

28. The apparatus of claim 23, wherein the static checksum information includes a first checksum component associated with the static information in the packet flow, and wherein the further information includes a plurality of further checksum components, each of the further checksum components representing an associated bit position of the transient portion of the headers in the packet flow, said combiner operable for combining said further checksum components with said first checksum component to produce the checksum.

29. The apparatus of claim 28, wherein said combiner includes computation logic for adding, modulo-2, each of the further checksum components to the first checksum component.

30. The apparatus of claim 28, wherein said static checksum information includes a second checksum component that represents a plurality of bit positions in the transient portion of the headers in the packet flow, said combiner operable for combining said further checksum components with said first and second checksum components to produce the checksum.

31. The apparatus of claim 23, wherein the combiner is operable to generate a CRC checksum.

32. The apparatus of claim 23, provided in the packet receiving station.

33. The apparatus of claim 23, provided in the packet transmitting station.

* * * * *